United States Patent [19]
Sharpe-Geisler

[11] Patent Number: 5,406,139
[45] Date of Patent: Apr. 11, 1995

[54] INPUT BUFFER UTILIZING A CASCODE TO PROVIDE A ZERO POWER TTL TO CMOS INPUT WITH HIGH SPEED SWITCHING

[75] Inventor: Bradley A. Sharpe-Geisler, San Jose, Calif.

[73] Assignee: Advanced Micro Devices, Inc., Sunnyvale, Calif.

[21] Appl. No.: 34,510

[22] Filed: Mar. 19, 1993

[51] Int. Cl.⁶ .................................... H03K 17/10
[52] U.S. Cl. ..................... 326/71; 326/121; 326/45
[58] Field of Search ............... 307/443, 451, 465, 475

[56] References Cited

U.S. PATENT DOCUMENTS

| | | | |
|---|---|---|---|
| 4,593,212 | 6/1986 | Svager | 307/475 |
| 4,672,243 | 6/1987 | Kirsch | 307/475 |
| 4,791,323 | 12/1988 | Austin | 307/475 |
| 4,825,106 | 4/1989 | Tipon et al. | 307/443 X |
| 5,144,167 | 9/1992 | McClintock | 307/475 |
| 5,151,622 | 9/1992 | Thrower et al. | 307/451 X |

FOREIGN PATENT DOCUMENTS 62-98911  5/1987  Japan ................ H03K 19/00

OTHER PUBLICATIONS

"An 11000-Fuse Electrically Erasable Programmable Logic Device (EEPLD) With An Extended Macrocell," S. E. Wahlstrom, et al., *IEEE Journal of Solid-State Circuits*, vol. 23, No. 4, Aug. 1988, New York, N.Y. pp. 916–922.

*Primary Examiner*—David R. Hudspeth
*Attorney, Agent, or Firm*—Fliesler, Dubb, Meyer & Lovejoy

[57] ABSTRACT

An input buffer for utilization in a programmable logic device (PLD). The input buffer includes an inverter consisting of a PMOS pull up transistor one half the size of a corresponding NMOS pull down transistor to enable TTL compatibility. To drive a high capacitance load, instead of utilizing further buffering which introduces gate delays, a cascode transistor is used to control an additional pull up output driver connected to the output of the inverter. The cascode functions to turn on the additional pull up output driver to supplement the PMOS pull up transistor during a low to high transition of the output. The input buffer further includes a switching transistor coupled between a $V_{DD}$ power supply and the PMOS pull up transistor to cut power to the PMOS pull up transistor when the inverter has a low output. With no utilization of power during a low output, the input buffer provides a zero power TTL input enabling the input buffer to be utilized on circuitry in battery powered devices.

15 Claims, 6 Drawing Sheets

INPUT BUFFER UTILIZING A CASCODE TO PROVIDE A ZERO POWER TTL TO CMOS INPUT WITH HIGH SPEED SWITCHING

BACKGROUND OF THE INVENTION

1. Field of the Invention

The present invention relates to an input buffer which provides an interface between a digital integrated circuit and circuitry external to the digital integrated circuit. More particularly, the present invention relates to an input buffer for a programmable array logic (PAL) device.

2. Description of the Related Art

FIG. 1 shows a block diagram for the AmPAL-CE22V10, a typical programmable logic device manufactured by Advanced Micro Devices, Inc. The internal circuitry of the AmPALCE22V10 is CMOS logic. To enable the circuitry of the AmPALCE22V10 to be compatible with circuitry external to the chip, which is may be TTL logic, input buffers 100(a-1) are utilized.

The AmPALCE22V10 further includes output logic macrocells 102 connected to provide an output which registered or combinatorial. The output from the output logic macrocell can be fed back into an input buffer on the chip.

FIG. 2 shows typical prior art input buffer, such as that utilized on the AmPALCE22V10. In FIG. 2, an input signal to the input buffer is received by a CMOS inverter 200. In order for the input buffer of FIG. 2 to be TTL compatible, the CMOS inverter 200 should have a threshold at around 1.5 volts, assuming a valid TTL high level is 2.0 volts.

The 1.5 volt threshold is achieved by making the PMOS transistor 202 of inverter 100 relatively weak, or about half the size of the NMOS transistor 204. Note that circles on transistors, such as transistor 202, indicate a P-type transistor, while no circle on a transistor indicates an N-type transistor. With transistor 202 being half the size of transistor 204 inverter 200 has approximately a quarter of the drive capability because of the reduced mobility of holes in relation to electrons.

Note that a TTL high to a standard CMOS input will result in the PMOS 202 not turning off completely so that the first inverter will draw power. Typically, the input would have to be raised to within less than 1.0 volt of the supply voltage for the input stage to not draw power.

To avoid TTL high power consumption, extra steps may be added to a standard CMOS fabrication process to create a PMOS transistor which turns completely off at TTL high input levels.

Inverters 206 and 208 are added to the output of inverter 200 in order to drive a high capacitance node connected to the input buffer output. Note, however, that each inverter added to the signal path of the input buffer has an inherent gate delay so that the decision to add buffering in order to achieve the highest performance is dependent upon the capacitance level of circuitry connected to the output node of the input buffer.

SUMMARY OF THE INVENTION

The configuration of the present invention provides fewer gate delays than the input buffer of FIG. 2 to drive a capacitive load. Additionally, a configuration of the present invention enables the input buffer to burn zero power with a TTL high input level, enabling the input buffer to be utilized on circuitry in battery powered devices such as lap top computers. The configuration of the present invention also allows compatibility to CMOS circuitry operating at different voltage levels such as between 5.0 volt CMOS, and 3.0 volt CMOS.

The present invention is an input buffer circuit utilizing an inverter consisting of a PMOS pull up transistor one half the size of a corresponding NMOS pull down transistor to enable TTL compatibility as well as compatibility to lower voltage CMOS circuits. To drive a high capacitance load, instead of utilizing further buffering, a cascode transistor controls an additional pull up output driver connected to the output of the inverter. The cascode functions to turn on the additional pull up output driver to supplement the PMOS pull up transistor during a high to low transition of the input.

The input buffer utilizes feedback from the inverter output to control whether or not the source of the cascode is connected to the inverter input. In one embodiment, feedback is also utilized to provide an additional current source to more rapidly switch the output driver transistor off after the output has switched high.

In another embodiment, the input buffer of the present invention further includes a switching transistor coupled between a $V_{DD}$ power Supply and the PMOS pull up transistor to cut power to the PMOS pull up transistor when the input buffer has a high input. With no utilization of power during a high input, the input buffer provides a zero power TTL input enabling the input buffer to be utilized on circuitry in battery powered devices such as lap top computers.

BRIEF DESCRIPTION OF THE DRAWINGS

Further details of the present invention are explained with the help of the attached drawings in which.

DESCRIPTION OF THE PREFERRED EMBODIMENTS

Figure 2:
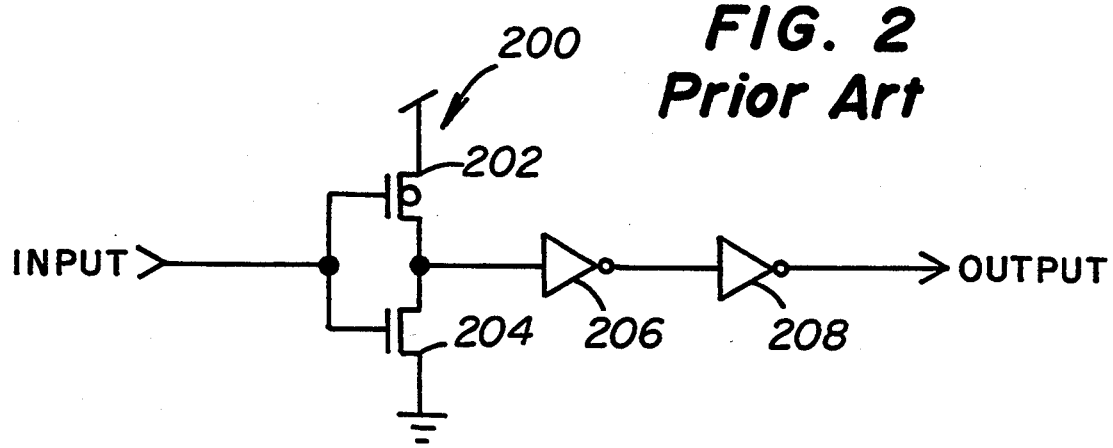
FIG. 2 shows a typical prior art input buffer.
Figure 3:
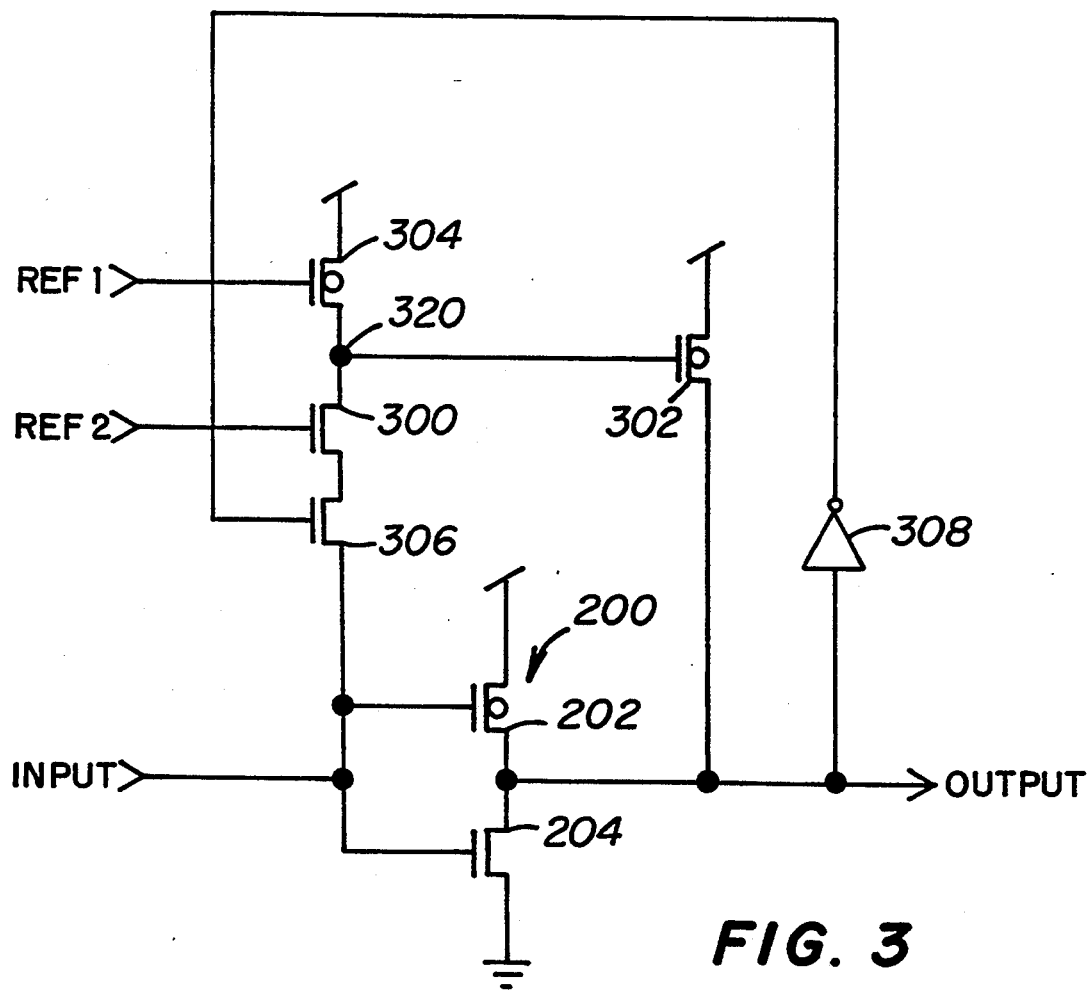
FIG. 3 shows an embodiment of an input buffer of the present invention.

FIG. 3 shows an embodiment of an input buffer of the present invention. As in FIG. 2, the input buffer of FIG. 3 includes an inverter 200 receiving an input data signal, the inverter including a PMOS pull up transistor and an NMOS pull down transistor 204. As in FIG. 2, transistor 202 is approximately half the size of the transistor 204. For convenience, like reference numbers for components in the circuitry of FIG. 2 which are referenced in FIG. 3 are carried over.

FIG. 3 further includes a cascode amplifier 300 and a strong pull up driver transistor 302 which is configured to augment the relatively weak PMOS pull up transistor 202. A current source transistor 304 is connected to supply power to the cascode 300 and the gate of pull up driver transistor 302 at node 320. A weak current is supplied by current source transistor 304 as controlled by voltage reference REF1 applied to its gate. The weak current source is necessary so as not to load the input excessively during high to low transitions where the current sourced by transistor 304 must be overcome by whatever is driving the input.

A voltage reference REF2 is supplied to the gate of cascode 300 so that cascode 300 turns on when its source drops to somewhere in the vicinity of the desired input threshold, the threshold being 1.5 volts for TTL compatible inputs. A switching transistor 306 connects the source of cascode 300 to the input of inverter 200. An inverter 308 connected to the output of inverter 200 is connected to the gate of switching transistor 306 to control switching.

Note that a cascode transistor is a transistor defined by being turned on and off by varying voltage applied to the source with the gate voltage fixed, rather than varying the gate voltage. In a cascode transistor with $(v_g-v_s) > v_t$, wherein $v_g$ is the gate voltage, $v_s$ is the source voltage, and $v_t$ is the threshold voltage of the transistor, the cascode transistor will turn on. With $(v_g-v_s) < v_t$, the cascode transistor will turn off.

In operation, when the input of FIG. 3 is low, NMOS pull down transistor 204 is off while PMOS pull up transistor 202 is on, thus pulling the output high. The output of inverter 308 will be low, thus turning off switching transistor 306. Because transistor 306 is off, the source of cascode 300 will be pulled up by current source 304 until cascode 300 turns off, approximately 1 volt below REF2. Node 320 will then be pulled up to $V_{DD}$, turning off pull up driver transistor 302. At this point, the only transistor holding the output high is PMOS pull up transistor 202.

When the input goes high, 3 volts for instance, NMOS transistor 204 turns on overcoming PMOS transistor 202. Note that with 3 volts on its gate, PMOS transistor 202 does not turn off, but does source significantly less current which is overcome by NMOS transistor 204 to pull down the output. When the output is low, inverter 308 turns on switching transistor 306. At this point nothing happens, for as long as the input is high, cascode 300 remains off.

When the input goes low, NMOS transistor 204 turns off and PMOS transistor 202 turns on more strongly. Simultaneously, cascode 300 turns on overcoming current source 304 to pull node 320 low which turns on pull up driver transistor 302. Pull up driver transistor 302 and PMOS pull up transistor 202 together pull up the output. Pull up driver transistor 302 supplies sufficient current so that no further buffering is required for connecting the input buffer output to a substantial capacitive load.

When the output goes high again, inverter 308 turns off transistor 306 and operation continues as described above.

Figure 4:
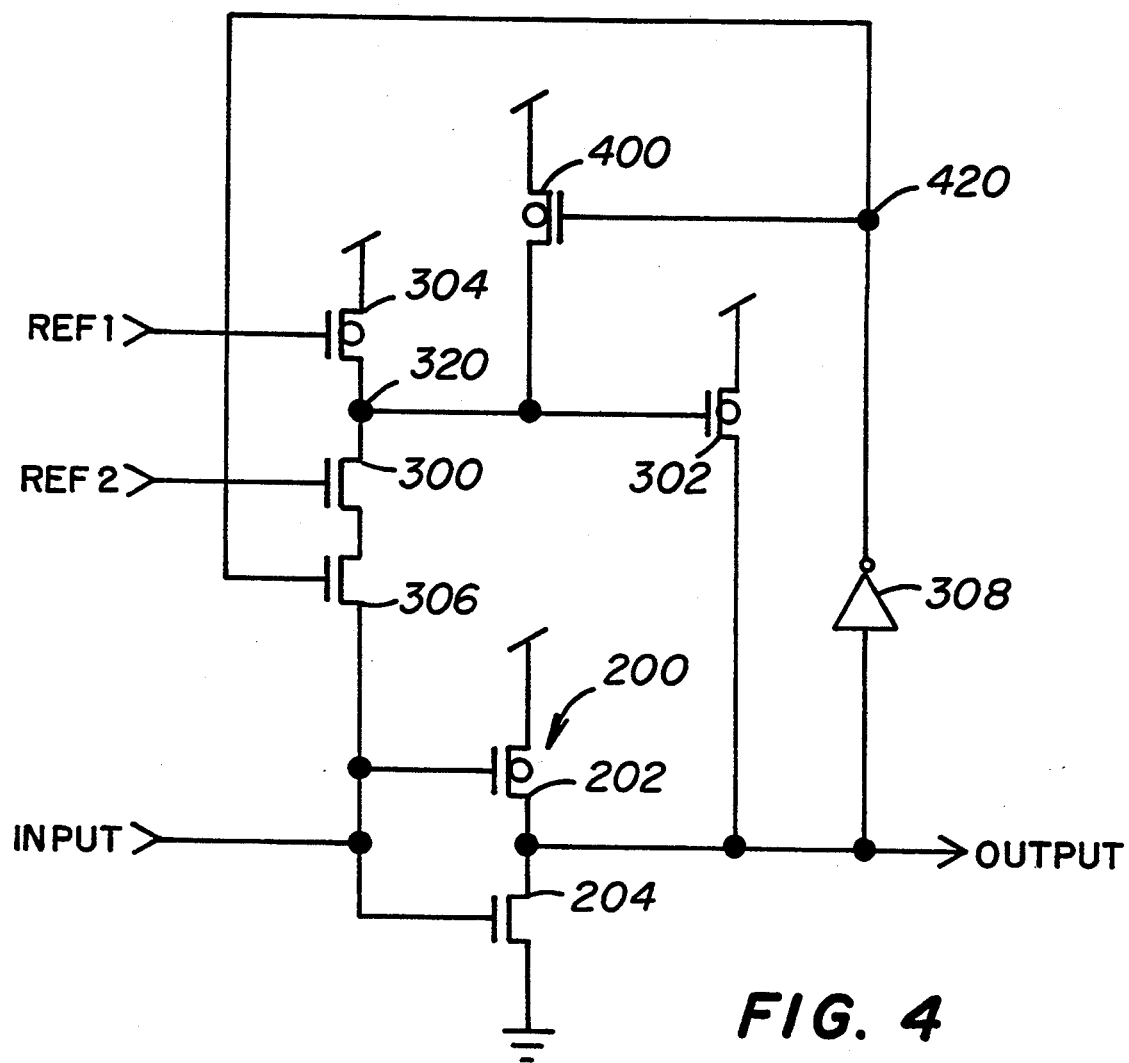
FIG. 4 shows the embodiment of FIG. 3 further utilizing an additional current source transistor connected to turn off the output driver transistor more quickly.

FIG. 4 shows the embodiment of FIG. 3 further utilizing an additional transistor 400 connected to turn off the output driver transistor 302 more quickly. Transistor 400 has a gate connected to the output of invertor 308 at node 420. The drain of current source transistor 400 is connected to supply power from $V_{DD}$ to node 320 to which the gate of output driver transistor 302 is connected. For convenience, like reference numbers are utilized for components in the circuitry of FIG. 4 which are carried over from FIG. 3.

In operation, when node 420 goes low after a low to high transition of the output, current source transistor 400 will turn on to more rapidly pull node 320 high in order to turn output driver transistor 302 off more quickly.

Figure 5:
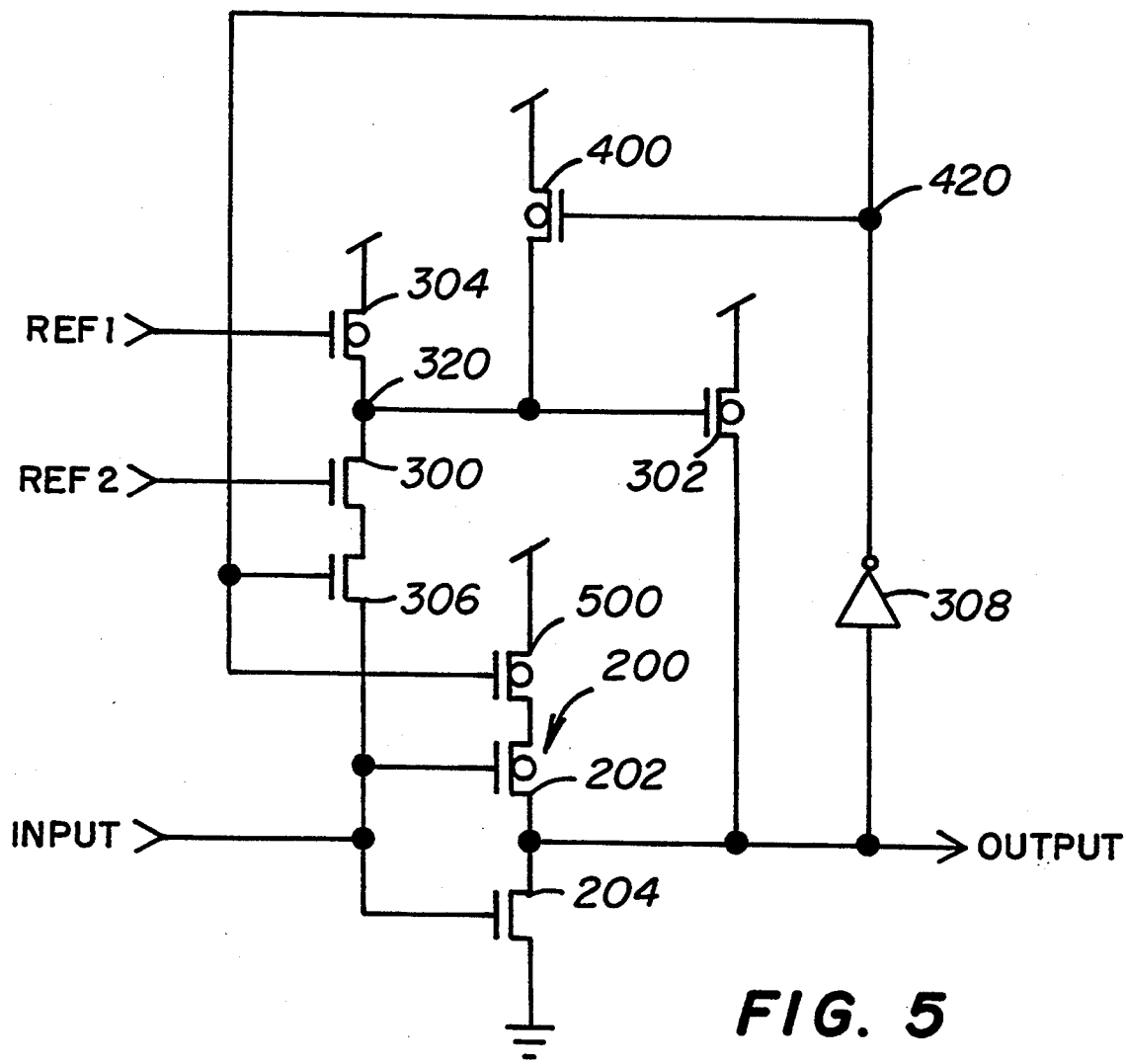
FIG. 5 shows the embodiment of FIG. 4 further utilizing a power supply switching transistor connected in series with the PMOS pull up transistor cutting power utilized to zero when the input buffer output is low.

FIG. 5 shows the embodiment of FIG. 4 further utilizing a power supply switching transistor 500 connected between the $V_{DD}$ power supply and the PMOS pull up transistor 202. The gate of power supply switching transistor 500 is connected to inverter 308 to be controlled by the input buffer output. For convenience, like reference numbers are utilized for components in the circuitry of FIG. 5 which are carried over from FIG. 4.

In operation, when the input buffer input is at a TTL high, the input buffer output will be low turning off power supply switching transistor 500 to cut off the supply of current to PMOS pull up transistor 202. Switching transistor 500, thus, enables zero power operation.

When the input buffer input goes low, the low to high transition of the output is now handled exclusively by pull up driver transistor 302 because PMOS pull up transistor 202 will be disabled by switching transistor 500. Cascode 300 turns on which pulls down node 320 and turns on pull up driver transistor 302 which pulls up the output.

When the output is high, inverter 308 pulls node 420 low which turns off switching transistor 306, thus isolating the cascode 300. The inverter 308 additionally turns on the additional current source transistor 400 on which assists current source 304 in pulling node 320 high to turn off pull up driver transistor 302. The inverter further turns on power supply switching transistor 500 which enables PMOS transistor 202 to hold the output high.

When the input goes high again, operation continues as described above.

Figure 6:
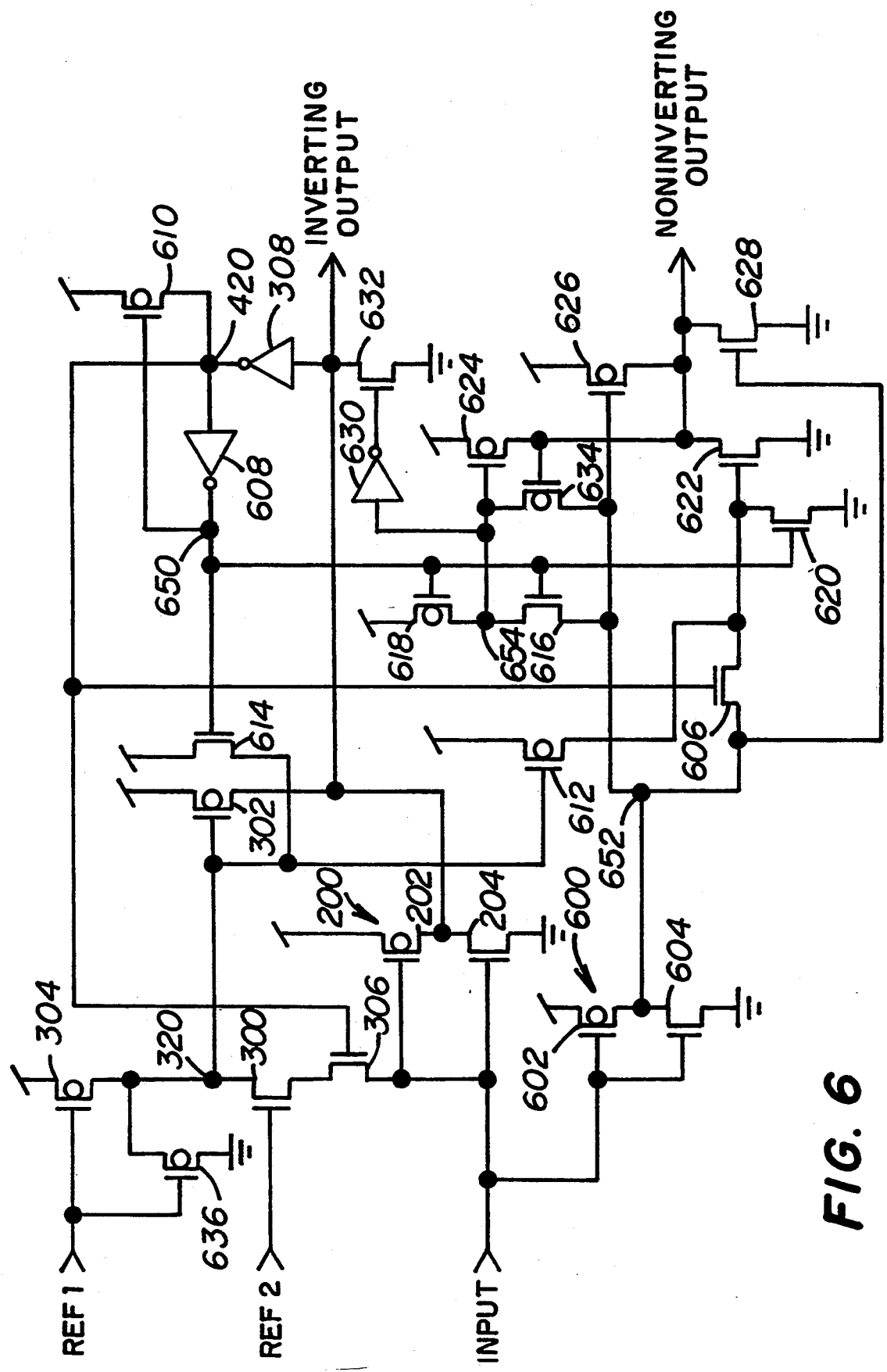
FIG. 6 shows the non-zero power embodiment of FIG. 4 further utilizing circuitry to provide an inverted and a noninverted input buffer output.

FIG. 6 shows the non-zero power embodiment of FIG. 4 further utilizing circuitry to provide an inverted and a noninverted input buffer output. For convenience, like reference numbers are utilized for components in the circuitry of FIG. 6 which are carried over from FIG. 4.

The input of FIG. 6 is connected to the inverter 200 as well as an additional inverter 600 containing an PMOS pull up transistor 602 and an NMOS pull down transistor 604. The output of inverter 200 supplies the inverting output, while inverter 600 is connected at node 652 to directly to the gates of inverter transistors 626 and 628 as well as directly to inverter transistor 622 and indirectly to inverter transistor 624 to control the supply of power to the noninverting output.

Node 652 is connected indirectly to the gate of transistor 624 through node 654 by transistor 616. Node 654 further supplies an inverter 630 connected to the gate of transistor 632 which connects the inverting output to ground. Node 654 is tied to node 652 when the noninverted output is low by transistor 634 which has its gate connected to the noninverting output.

The output of inverter 200 is connected through an inverter 308 to a node 420 similar to FIG. 4. In addition to driving switching transistor 306 as in FIG. 4, node 420 also drives switching transistor 606 connecting node 652 to the gate of inverter transistor 622. Additionally, in FIG. 6, node 420 is connected by an inverter 608 to node 650. Transistor 610 has a gate connected to provide hysteresis feedback from node 650 to control node 420.

Node 650 provides a gate input to a current source transistor 614, an NMOS version of PMOS current source transistor 400 of FIG. 4. Current source transistor 614 provides supplemental current to pull up driver transistor 302 for inverter 200 as well as for a pull up driver transistor 612 for inverter 600. Node 650 further provides a gate input to inverter transistors 616 and 618 as well as a switching transistor 620 connecting the gate of inverter transistor 622 to ground.

In operation, we assume initially that the input is low making the inverted output high by means of PMOS pull up transistor 202. With the inverting output high, inverter 308 will provide a low to node 420 which turns off switching transistors 306 and 606 allowing node 320 to be pulled high. Inverter 608 will output a high with transistor 610 adding hysteresis which turns on transistors 614, 616 and 620. Transistor 616 being on allows current to flow in the gate of transistor 624. By means of PMOS pull up transistor 602 of inverter 600, node 652 is pulled high which turns off transistor 626, turns on transistor 628, and by virtue of the fact that transistor 616 is on, turns transistor 624 off bringing the noninverting output low.

When the input is brought high, NMOS pull down transistor 204 turns on and overcomes PMOS transistor 202 and thus begins to pull down the inverted output. Likewise, NMOS pull down transistor 604 turns on and overcomes PMOS transistor 602. Node 652 will have much less capacitance than the inverted output so that it will be pulled down more quickly. Because transistor 616 is on, node 654 via inverter 630 turns on transistor 632 to assist NMOS transistor 204 in pulling down the inverted output. Because nodes 652 and 654 are both low, transistors 624 and 626 will be on and transistor 628 will turn off thus bringing the non-inverting output high. After the inverting output goes low, inverter 308 pulls up node 420 which turns on transistors 306 and 606. Inverter 608 then pulls down node 650 which turns off transistors 614, 620, and 616 while turning on transistor 618. Transistors 624 and 632 are thus disabled, while transistor 622 is enabled.

When the input is brought low, cascode 300 turns on pulling node 320 low. Node 320 had been pre-charged to 0.7 volts below the $V_{DD}$ supply voltage by transistors 304 and 636. With node 320 low, driver transistor 302 and 612 turn on assisting PMOS transistors 202 and 602 in pulling up the inverted output and node 652 respectively. When node 652 is pulled high, transistors 622 and 628 are turned on while transistor 626 is turned off, thus pulling down the noninverting output. Inverter 308 then pulls node 420 low which turns off transistors 306 and 606. Inverter 608 then pulls node 650 high which turns on transistor 614 to pull up node 320 to $V_{DD}-1$ volt. Transistor 620 is turned on which turns off transistor 622.

Figure 7:
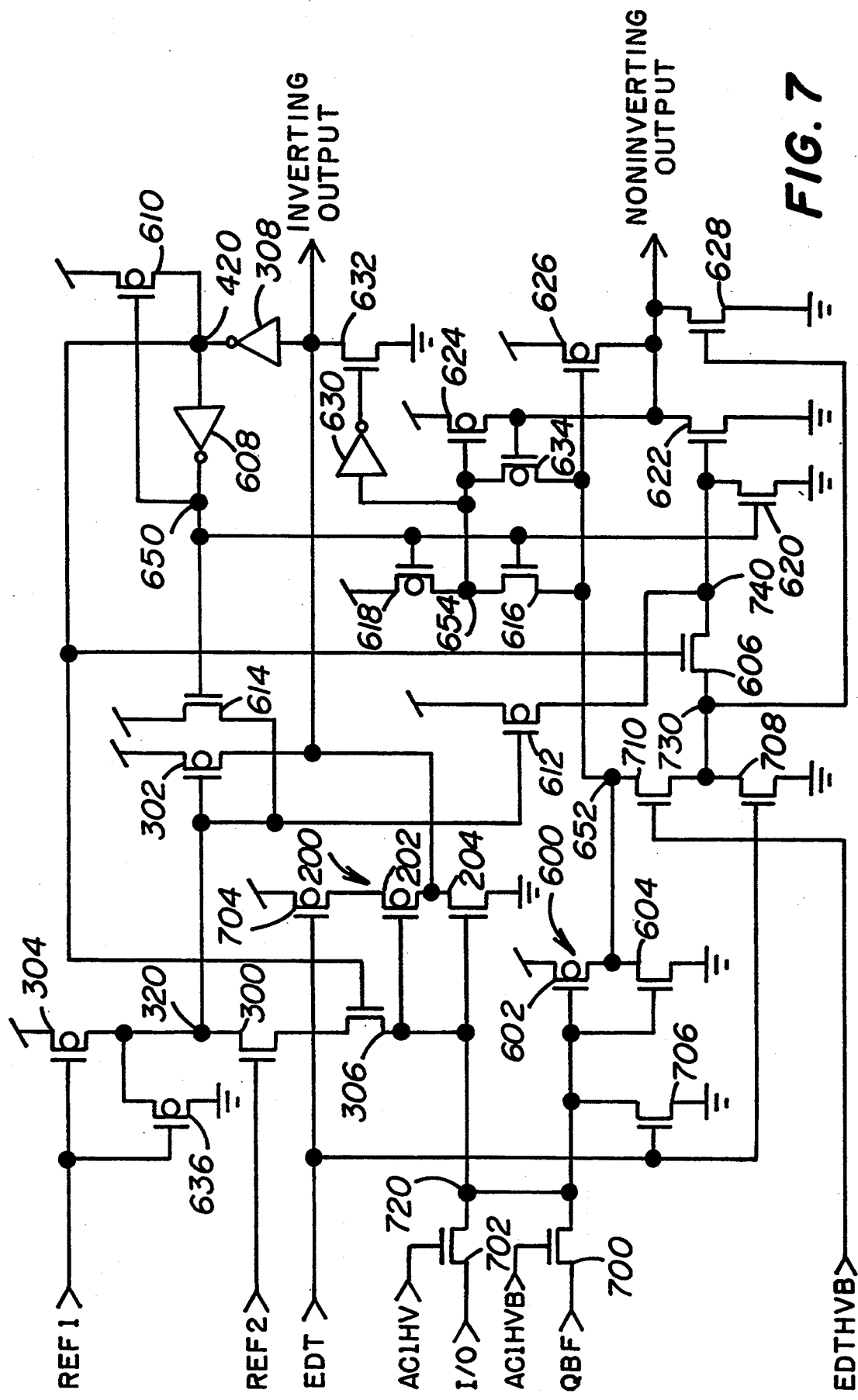
FIG. 7 shows the embodiment of FIG. 6 with further features added so that the input buffer may be utilized on the AmPALCE22V10.

FIG. 7 shows the embodiment of FIG. 6 with further features added so that the input buffer may be utilized on the AmPALCE22V10. FIG. 7 utilizes the circuitry of FIG. 6 along with additional circuitry for providing a registered feedback input and circuitry for providing an edit mode. For convenience, like reference numbers are utilized for components in the circuitry of FIG. 7 which are carried over from FIG. 6.

Registered feedback is provided at the QBF input of transistor 700 of FIG. 7, while normal inputs are provided at the I/O input of transistor 702. AC1HV and AC1HVB are input signals provided to the gates of transistors 702 and 700 respectively to enable either the I/O input or the QBF input respectively. Transistors 700 and 702 are connected to provide an output to the input buffer circuitry at node 720 which makes up the input of the input buffer of FIG. 6. Note that the letter "B" in input labels, such as in QBF and AC1HVB, indicate these inputs are active low, while "HV" indicates a high voltage is applied.

Figure 1:
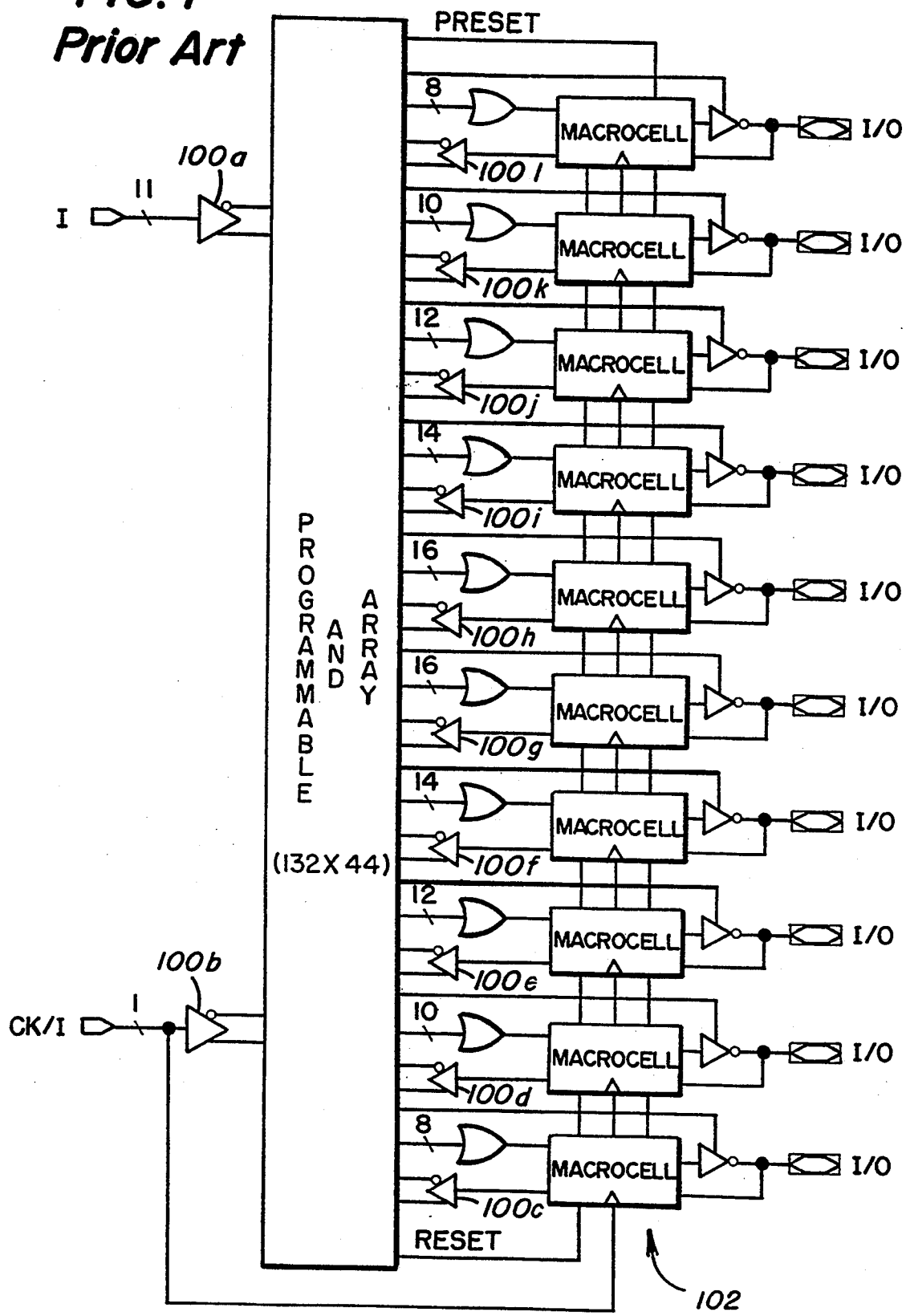
FIG. 1 shows a block diagram for the AmPAL-CE22V10.

In operation with registered feedback, I/O is chosen as the input with AC1HV high and AC1HVB low. Registered feedback is provided when AC4VB is high and AC1HV is low. Registered feedback is provided from the output macrocell as shown in FIG. 1. During edit mode, AC1HV and AC1HVB are both low to isolate the input node 720.

An edit mode is provided by transistor 704, 706 and 708 receiving an EDT gate input and a transistor 710 receiving an EDTHVB gate input. Transistor 704 is connected between the $V_{DD}$ and PMOS pull up transistor 200 similar to transistor 500 of FIG. 5 enabling a zero power consumption. Transistor 706 connects the input to ground and transistor 708 connects the input of transistor 606 at node 703 to ground. Transistors 710 connects node 652 and transistor 606.

In operation with an edit mode, EDTHVB is low which turns off transistor 710. EDT is high which turns off transistor 704 disabling PMOS transistor 202 and turns on transistors 706 and 708 which pull down nodes 720 and 730 respectively. Nodes 720 and 730 being low turn off transistor 628 and transistors 204 and 604 respectively and turn on transistor 602 Transistor 602 pulls up node 652 to turn off transistor 626. REF2 is low which turns off cascode 300 allowing current source 304 to pull up node 320 and turn off driver transistor 302. Node 650 is in an unknown state depending upon whether the inverting output is high or low.

If node 650 is high, then node 652 will pull up node 654 through transistor 616 thus turning off transistor 624 and transistor 632 via inverter 630. Note that transistor 624 is latched to node 652 if the noninverting output is low via transistor 634. Transistor 620 will then pull node 740 low turning off driver transistor 622.

If node 650 is low then transistor 618 will be on, again pulling up node 654. Node 420 will be high which will turn on transistor 606 tying node 740 to node 730 which is already low. Thus, both the inverting and noninverting outputs are tristated.

Although the invention has been described above with particularity, this was merely to teach one of ordinary skill in the art how to make and use the invention. Many modifications will fall within the scope of the invention, as that scope as defined by the following claims.

What is claimed is:

1. An input buffer comprising:
   an inverter having an inverter input and an inverter output;
   a current source;
   a pull up driver transistor having a source to drain path connecting a power supply to the inverter output and a gate connected to the current source; and
   a cascode transistor having a drain coupled to the gate of the pull up driver transistor, a source coupled to the inverter input and a gate connected to a reference potential.

2. The input buffer of claim 1 wherein further comprising:
a feedback inverter having an input connected to the inverter output and an output; and
a p-channel zero power switching transistor having a source to drain path coupling the power supply to the inverter and a gate connected to the feedback inverter output.

3. The input buffer of claim 1 further comprising:
a feedback inverter having an input connected to the inverter output and an output;
a switching transistor having a source to drain path coupling the source of the cascode transistor to the inverter input and a gate connected to the feedback inverter output;
a p-channel supplemental current source transistor having a gate connected to the feedback inverter output and a source to drain path coupling the power supply to the gate of the pull up driver transistor; and
a p-channel zero power switching transistor having a source to drain path coupling the power supply to the inverter and a gate connected to the feedback inverter output.

4. The input buffer of claim 1 further comprising:
a switching transistor having a source to drain path coupling the source of the cascode transistor to the inverter input, the switching transistor having a gate coupled to the inverter output.

5. The input buffer of claim 1 further comprising:
a supplemental current source transistor having a gate coupled to the inverter output and a source to drain path coupling the power supply to the gate of the pull up driver transistor.

6. The input buffer of claim 1 further comprising:
a zero power switching transistor having a source to drain path coupling the power supply to the inverter, the zero power switching transistor having a gate coupled to the inverter output.

7. The input buffer of claim 1 further comprising:
a feedback inverter having an input connected to the inverter output and an output; and
a p-channel supplemental current source transistor having a gate connected to the feedback inverter output and a source to drain path coupling the power supply to the gate of the pull up driver transistor.

8. An input buffer for a programmable array logic device, the programmable array logic device having a PAL input for receiving either a registered input or a nonregistered input, the input buffer comprising:
an inverter having an inverter input for receiving the PAL input and an inverter output for supplying a buffer output, the inverter comprising:
a pull up transistor; and
a pull down transistor substantially larger than the pull up transistor;
a current source transistor;
a pull up driver transistor connected to supply power to the inverter output, the pull up driver transistor having a gate coupled to the current source transistor;
a cascode transistor having a drain coupled to the gate of the pull up driver transistor and to the current source transistor; and a switching transistor coupling a source of the cascode transistor to the inverter input, the switching transistor having a gate coupled to the inverter output.

9. The input buffer of claim 8 further comprising:
a supplemental current source having a gate coupled to the inverter output, the supplemental current source coupled to supply current to the gate of the pull up driver transistor.

10. The input buffer of claim 8 further comprising:
an inverter power supply; and
a zero power switching transistor having a current path coupled between the inverter power supply and the pull up transistor of the inverter, the zero power switching transistor having a gate coupled to the inverter output.

11. An input buffer having an input, an inverting output and a noninverting output, the input buffer comprising:
a first inverter (200) having an input forming the input buffer input and an output forming the inverting output;
a current source (304,636);
a first p-channel pull up driver transistor (302) having a source to drain path connecting an upper power supply to the inverting output and a gate connected to the current source;
a cascode transistor (300) having a drain coupled to the gate of the pull up driver transistor, a gate connected to a reference potential and a source;
a first switching transistor (306) having a source to drain path connecting the source of the cascode transistor to the inverter input, and a gate; and
a second inverter (308) having an input connected to the inverting output and an output connected to the gate of the switching transistor.

12. The input buffer of claim 11 further comprising:
a third inverter (600) having an input connected to the input of the input buffer and an output; and
a fourth inverter (626,628) having a p-channel pull up transistor with a source to drain path connecting the upper power supply to the noninverting input and a gate connected to the third inverter output, and an n-channel pull down transistor with a source to drain path connecting the noninverting input to a lower power supply and a gate coupled to the third inverter output.

13. (New) The input buffer of claim 12 further comprising:
a fifth inverter (622,624) having a p-channel pull up transistor (624) with a source to drain path connecting the upper power supply to the noninverting input and a gate connected to a first node, and an n-channel pull down transistor (622) with a source to drain path connecting the noninverting input to a lower power supply and a gate connected to a second node;
a second p-channel pull up driver transistor (612) having a source to drain path coupling the upper power supply to the second node and a gate connected to the current source (304,636);
a second switching transistor (606) having a source to drain path connecting the second node to the output of the third inverter (600) and a gate connected to the output of the second inverter (308);
a sixth inverter (608) having an input connected to the output of the second inverter (308) and an output;

a supplemental current source transistor (614) having a source to drain path connecting the upper power supply to the gate of the first p-channel pull up driver transistor (302), and a gate coupled to the output of the sixth inverter (608);

a first p-channel connection transistor (618) having a source to drain path connecting the upper power supply to the first node, and a gate connected to the output of the sixth inverter (608);

a first n-channel connection transistor (616) having a source to drain path connecting the first node to the output of the third inverter (600), and a gate connected to the output of the sixth inverter (608);

a second p-channel connection transistor (634) having a source to drain path connecting the first node to the output of the third inverter (600), and a gate connected to the noninverting output; a second n-channel connection transistor (620) having a source to drain path connecting the lower power supply to the second node, and a gate connected to the output of the sixth inverter (608);

a seventh inverter (630) having an input connected to the second node and an output; and a third n-channel connection transistor (632) having a source to drain path connecting the inverting output to the lower power supply and a gate connected to the output of the seventh inverter (630).

14. The input buffer of claim 13 further comprising:
a hysteresis transistor (610) having a source to drain path connecting the upper power supply to the output of the second inverter (308), and a gate connected to the output of the sixth inverter (608).

15. The input buffer of claim 13 further receiving a output disabling signal (EDT) and a complementary disabling signal (EDTHVB) which is the inverse of the output disabling signal (EDT), the input buffer further comprising:

a first power switching transistor (704) having a source to drain path connecting the upper power supply to the first inverter (200), and a gate coupled to receive the output disabling signal;

a second power switching transistor (706) having a source to drain path connecting the lower power supply to the input of the third inverter (600), and a gate coupled to receive the output disabling signal;

a third power switching transistor (708) having a source to drain path connecting the lower power supply to the gate of the pull down transistor (628) of the fourth inverter, and a gate coupled to receive the output disabling signal; and a fourth power switching transistor (710) having a source to drain path connecting the output of the third inverter (600) to the gate of the pull down transistor (628) of the fourth inverter, and a gate coupled to receive the complementary disabling signal.

* * * * *

UNITED STATES PATENT AND TRADEMARK OFFICE
CERTIFICATE OF CORRECTION

PATENT NO. : 5,406,139
DATED : April 11, 1995
INVENTOR(S) : Bradley A. Sharpe-Geisler It is certified that error appears in the above-indentified patent and that said Letters Patent is hereby corrected as shown below:

Column 2, line 25, delete "Supply" and insert --supply--.

Column 6, line 35, after the first occurrence of "602", insert --.--.

Column 8, line 48, delete "(New)".

Column 1, line 20, after "which", delete "is".

Column 1, line 23, after "which", insert --is--.

Signed and Sealed this

Twenty-seventh Day of August, 1996

Attest:

BRUCE LEHMAN

*Attesting Officer*      *Commissioner of Patents and Trademarks*